(12) United States Patent
Lu et al.

(10) Patent No.: US 12,520,561 B2
(45) Date of Patent: Jan. 6, 2026

(54) MULTIFUNCTIONAL MZO-BASED NEGATIVE CAPACITANCE THIN FILM TRANSISTOR ON GLASS OR FLEXIBLE SUBSTRATES

(71) Applicant: Rutgers, The State University of New Jersey, New Brunswick, NJ (US)

(72) Inventors: Yicheng Lu, East Brunswick, NJ (US); Fangzhou Yu, Piscataway, NJ (US); Wen-Chiang Hong, Tigard, OR (US)

(73) Assignee: RUTGERS, THE STATE UNIVERSITY OF NEW JERSEY, New Brunswick, NJ (US)

( * ) Notice: Subject to any disclaimer, the term of this patent is extended or adjusted under 35 U.S.C. 154(b) by 420 days.

(21) Appl. No.: 18/022,425

(22) PCT Filed: Aug. 23, 2021

(86) PCT No.: PCT/US2021/071249
§ 371 (c)(1),
(2) Date: Feb. 21, 2023

(87) PCT Pub. No.: WO2022/040702
PCT Pub. Date: Feb. 24, 2022

(65) Prior Publication Data
US 2024/0006507 A1    Jan. 4, 2024

Related U.S. Application Data

(60) Provisional application No. 63/068,507, filed on Aug. 21, 2020.

(51) Int. Cl.
*H10D 64/68* (2025.01)
*H10D 30/01* (2025.01)
*H10D 30/67* (2025.01)

(52) U.S. Cl.
CPC ......... *H10D 64/689* (2025.01); *H10D 30/031* (2025.01); *H10D 30/6729* (2025.01);
(Continued)

(58) Field of Classification Search
CPC ............... H10D 64/68; H10D 30/6755; H10D 86/423
See application file for complete search history.

(56) References Cited

U.S. PATENT DOCUMENTS 9,620,526 B2    4/2017   Suzumura et al.
9,722,092 B2    8/2017   Noda
(Continued)

FOREIGN PATENT DOCUMENTS

KR    20180136324 A    12/2018
WO    2019066875 A1    4/2019

OTHER PUBLICATIONS

Saleem et al., "Low dielectric constant and signature of ferroelectric nature in transistion metal (Co, Ni, Cu)-doped Mg0.5Zn0.5Al2O4 aluminates", Journal of Adv. Dielectrics, vol. 9, No. 4, 2019, 1950034 (Year: 2019).*

*Primary Examiner* — Vincent Wall
(74) *Attorney, Agent, or Firm* — FOX ROTHSCHILD LLP

(57) ABSTRACT

A multifunctional oxide based negative capacitance thin film transistor (NC-TFT) is built on glass or on flexible substrates, instead of on the single crystal substrates. It is therefore suitable for low-cost and large-area electronics, transparent electronics, or flexible electronics applications. The NC-TFT includes a semiconductor Magnesium Zinc Oxide (MZO) as the channel layer and a Nickel doped MZO ferroelectric material (NMZO) as the gate dielectric layer. Also disclosed are articles of manufacture methods of building the NC-TFT on glass and its transparent version NC-TTFT on glass.

17 Claims, 9 Drawing Sheets

(52) U.S. Cl.
CPC ....... *H10D 30/673* (2025.01); *H10D 30/6755* (2025.01); *H10D 30/6757* (2025.01)

(56) References Cited

U.S. PATENT DOCUMENTS

| | | | |
|---|---|---|---|
| 2007/0152217 A1* | 7/2007 | Lai | H10D 30/6755 438/149 |
| 2010/0237343 A1* | 9/2010 | Nakahara | H10H 20/817 257/E29.094 |
| 2013/0017567 A1* | 1/2013 | Lu | G01N 29/022 977/789 |
| 2019/0019800 A1 | 1/2019 | Yoo et al. | |
| 2019/0237582 A1* | 8/2019 | Lu | C23C 16/407 |
| 2019/0326444 A1 | 10/2019 | Akimoto et al. | |
| 2020/0013784 A1* | 1/2020 | An | H10B 51/40 |
| 2020/0144293 A1 | 5/2020 | Majhi et al. | |
| 2020/0203381 A1 | 6/2020 | Rabkin et al. | |
| 2021/0190717 A1 | 6/2021 | Lu et al. | |
| 2024/0006507 A1* | 1/2024 | Lu | H10D 30/6739 |

* cited by examiner

MULTIFUNCTIONAL MZO-BASED NEGATIVE CAPACITANCE THIN FILM TRANSISTOR ON GLASS OR FLEXIBLE SUBSTRATES

CROSS-REFERENCE TO RELATED APPLICATIONS

This application claims priority under 35 U.S.C. § 119(e) to U.S. Provisional Patent Application Ser. No. 63/068,507, filed on Aug. 21, 2020, which is hereby incorporated by reference in its entirety.

FIELD OF THE INVENTION

The present invention relates to negative capacitance thin-film transistors incorporating MgZnO-based semiconductor channel and NiMgZnO-based ferroelectric gate dielectric layer.

BACKGROUND OF THE INVENTION

Scaling down operating voltage and reducing power consumption remain a significant challenge in evolution of integrated circuit (IC). Negative capacitance field effect transistor (NC-TFT) is designed to reduce operation voltage and power consumption by reducing the subthreshold swing through the use of ferroelectric materials. However, improvements have been limited due to performance, stability, and cost issues. A primary reason is that the Boltzmann limit sets a thermionic bottleneck of the subthreshold swing (SS) value as 60 mV/dec at 300 K in the conventional field effect transistor (TFT), therefore circumvents further lowering the operating voltage and overall power consumption. A need for new technology exists to reduce supply voltage and power consumption.

SUMMARY

The technology of this patent document addresses the need. Disclosed herein is a novel oxide negative capacitance thin film transistor (NC-TFT) using multifunctional MZO materials. The NC-TFT integrates semiconductor MZO channel and ferroelectric MZO gate dielectric layer in the same unit. The minimum SS value can be reduced to below 60 mV/dec when Ni doped MZO is utilized in the construction of the ferroelectric layer of the NC-TFT. As a result, the lowered operating voltage could break the conventional IC tradeoff between switching performance and power dissipation. This oxide NC-TFT technology finds broad applications in low power consumption and steep switching applications including flat-panel displays, solar panels, IoT, sensors, radio-frequency identification (RFID), and flexible electronics (e.g. wearable systems).

An aspect of this patent document provides a NC-TFT with SS value below 60 mV/decade. The NC-TFT generally includes the following components:
a substrate;
a gate electrode deposited and patterned on the substrate;
a ferroelectric layer deposited over the substrate and the bottom gate, wherein the ferroelectric layer comprises $Ni_xMg_yZn_{1-x-y}O$, wherein x is greater than 0 and equal or less than 0.05 and y is greater than 0.05 and equal or less than 0.30;
a dielectric insulating layer in contact with the ferroelectric layer to form a gate dielectric stack structure;
a semiconductor $Mg_zZn_{1-z}O$ (MZO) channel layer deposited over the dielectric insulating layer, wherein z is greater than 0 and equal or less than 0.06, wherein the channel layer is in contact with the dielectric insulating layer or via a thin transition layer; and
a source and a drain positioned on opposite side of the MZO channel layer.

In some embodiments, x ranges from about 0.01 to about 0.03. In some embodiments, y ranges from about 0.08 to about 0.20. In some embodiments, z ranges from about 0.02 to about 0.05.

In some embodiments, the ferroelectric layer has a thickness ranging from about 5 nm to about 150 nm. In some embodiments, the channel layer has a thickness ranging from about 10 nm to about 100 nm. In some embodiments, the dielectric insulating layer has a thickness ranging from about 10 nm to about 100 nm. In some embodiments, the NC-TFT further includes a thin transition layer comprising MgO between the channel layer and the dielectric insulating layer with thickness ranging from 5 nm to about 15 nm.

In some embodiments, the dielectric insulating layer comprises a material selected from the group consisting of $SiO_2$, $Si_3N_4$, $Al_2O_3$, $HfO_2$, AlN, and any combination thereof. In some embodiments, the dielectric insulating layer consists essentially of $SiO_2$.

In some embodiments, the substrate is glass or ceramics. In some embodiments, the substrate is a transparent material. In some embodiments, the substrate is a flexible material. In some embodiments, the substrate comprises a rigid material selected from glass, ceramics and single crystals. In some embodiments, the substrate comprises a flexible material selected from polymers and plastics.

In some embodiments, the bottom gate electrode comprises an opaque metal selected from the group consisting of Cr, Al, Ti, Au and combination thereof. In some embodiments, the gate electrode, the source electrode and/or drain electrode comprise a transparent conductive oxide (TCO) selected from the group consisting of AlZnO (AZO), GaZnO (GZO), InSnO (ITO), InZnO (IZO), and any combination thereof.

Another aspect provides an electronic device containing the NC-TFT disclosed herein. the device is a RFID, sensing array, display, or photovoltaics. In some embodiments, the NC-TFT is a fully transparent NC-TFT (NC-TTFT).

Another aspect provides a method of manufacturing the NC-TFT described herein. The method generally includes:
(a) depositing and patterning a bottom gate electrode on a substrate;
(b) depositing a ferroelectric layer over the substrate and the bottom gate, wherein the ferroelectric layer comprises $Ni_xMg_yZn_{1-x-y}O$, wherein x is greater than 0 and equal or less than 0.05 and y is greater than 0.05 and equal or less than 0.30;
(c) depositing a dielectric insulating layer over the ferroelectric layer;
(d) depositing of semiconductor $Mg_zZn_{1-z}O$ (MZO) channel layer over the dielectric insulating layer, wherein z is greater than 0 and equal or less than 0.06 and
(e) depositing a source and a drain electrodes on opposite side of the MZO channel layer.

In some embodiments, the method further includes depositing a thin transition layer of MgO on the dielectric insulating layer prior to step (d).

DETAILED DESCRIPTION OF THE INVENTION

Figure 1A:
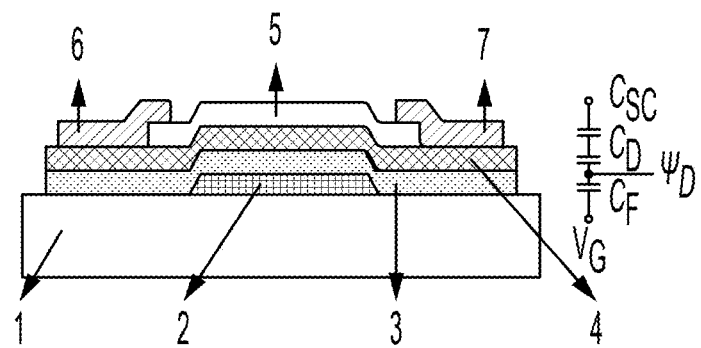
FIG. 1(a) illustrates a schematic layer structure of a bottom gate (BG)NC-TFT or NC-TTFT device with equivalent capacitance network shown on the right. The structure includes substrate 1, gate 2, ferroelectric layer 3, dielectric layer 4, semiconductor channel layer 5, source 6, and drain 7.

Various embodiments of the patent document provide NC-TFT and NC-TTFT as a solution for ultralow power logic devices. This technology finds broad applications in fields such as low-power electronics (RFID, sensors, IoT, etc.) and large-area electronics (display, solar panels, etc.) and low-thermal budget flexible devices such as wearable electronics. Among the many advantages of the new technology are reduced operation voltage, improved energy efficiency, low cost of materials (substrate and device) and fabrication process, and easy incorporation into various components and systems.

While the following text may reference or exemplify specific components of a device or a method of utilizing the device, it is not intended to limit the scope of the invention to such particular references or examples. Various modifications may be made by those skilled in the art, in view of practical and economic considerations, such as the size of an individual component and the process of manufacturing. Furthermore, as noted above, although in the illustrated embodiments specific ranges are disclosed, for example film thickness and doping level, and specific materials (gate dielectric, metallization schemes of gate, source, and drain, etc) and characteristics are described, it should be noted that such ranges, values, materials, and characteristics are merely illustrative for achieving a desired performance. As application and performance criteria change, other ranges, materials, and characteristics may be substituted, as known by those familiar with this technology.

The articles "a" and "an" as used herein refer to "one or more" or "at least one," unless otherwise indicated. That is, reference to any element or component of the present invention by the indefinite article "a" or "an" does not exclude the possibility that more than one element or component is present.

The term "about" as used herein refers to the referenced numeric indication with a reasonable scale, for example plus or minus 10% of that referenced numeric indication.

Although in the illustrated embodiments specific ranges are disclosed for values of, for example thickness, doping density, specific materials and characteristics are described, it should be noted that such ranges, characteristics and materials are merely illustrative for achieving a desired performance. As performance criteria change, other ranges, characteristics and materials may be substituted, as known by those familiar with semiconductor device physics and technology.

The negative capacitance thin film transistor (NC-TFT) and negative capacitance transparent thin film transistor (NC-TTFT) of this patent document is capable of amplifying gate voltage and lowering SS below 60 mV/dec. The NC-TFT and NC-TTFT utilizes multifunctional MgZnO material and incorporates a unique ferroelectric gate dielectric layer in combination with a semiconductor channel. The internal surface potential at the ferroelectric-oxide interface exceeds the applied gate voltage, which accelerates the turn-on behavior of the transistor and hence reduces SS even below the Boltzmann limit. As a result, the subthreshold swing (SS) value is significantly reduced while a high on/off current ratio can be maintained.

Without being bound by any particular theory, it is postulated that the surprising result of the NC-TFT and NC-TTFT in this patent document is attributed to proper doping of Mg and/or Ni in ZnO in the ferroelectric layer and the channel layer. Mg doping could lead to slight structural distortion along the polar c axis, resulting in conversion of the structure change from piezoelectric to ferroelectric. Because the ionic radius of $Mg^{2+}$ (0.65 Å) is smaller than that of $Zn^{2+}$ (0.74 Å), $Mg^{2+}$ is off centered located, deviating slightly from that of $Zn^{2+}$. The lattice of the pure ZnO is distorted, given the lattice parameters c/a ratio 1.6021, deviated from the ideal geometry value 1.633. Thus the hexagonal wurtzite structure is further deformed with Mg substitution from compressed c/a ratio. Studies have indicated that each Zn atom in ZnO is tetrahedrally coordinated to four O atoms and the Zn 3d-electrons hybridize with the O 2p-electrons. As Mg has no d-electrons, the substitution of Zn by Mg changes the electron distribution of d-p hybridization. It also proves to affect the bonding character and Zn—O bonding length along the c-axis, and induce local dipole moments. With ionic radii difference, Mg-doped ZnO has been reported to exhibit spontaneous polarization ($P_S$) of ~0.2 $\mu C/cm^2$ and ferroelectric-paraelectric phase transition temperature ($T_C$) at ~110° C. Ni can serve as compensation doping to reduce oxygen vacancy thus lower conductivity.

An aspect of this patent document provides novel NC-TFT (e.g. NC-TTFT) which exhibit SS value below 60 mV/decade. The technology offers low-power and high speed TFT for various devices including large-area electronics and wearable systems. The NC-TFT generally includes the following components:
- a substrate;
- a gate electrode deposited and patterned on the substrate;
- a ferroelectric layer deposited over the said substrate and the bottom gate, wherein the ferroelectric layer comprises $Ni_xMg_yZn_{1-x-y}O$, wherein Ni is used for doping to compensate residual electrons and x value is greater than 0 and equal or less than 0.05 and Mg doping is critical for ferroelectricity, y value is equal or greater than 0.05 and equal or less than 0.30, therefore provides the sufficient ferroelectric dipole moment but avoid the excessive structure disorder;
- a dielectric insulating layer deposited over the ferroelectric layer to form a gate dielectric stack structure;
- a semiconductor $Mg_zZn_{1-z}O$ (MZO) channel layer deposited over the dielectric insulating layer, wherein z is greater than 0 and equal or less than 0.06; this x range assures the stability of MZO over the pure ZnO, concomitantly avoids the electronic mobility degradation from the alloy disorder and scattering; and
- a source and a drain metal contact or transparent conductive oxide electrodes positioned on opposite side of the MZO channel layer.

In the NC-TFT, voltage amplification ($A_V$>1) is induced from spontaneous polarization charges in the ferroelectric layer to speed up the turn-on process and reduce the SS value. Various factors of the ferroelectric layer including the amount of Mg and Ni and the thickness of the layer can importance the performance of the NC-TFT in terms of $I_{DS}$-$V_{GS}$ value, SS behavior and on/off ratio for drain current $I_{DS}$.

In some embodiments, x ranges from about 0.001 to about 0.05, from about 0.005 to about 0.04, from about 0.01 to about 0.04, from about 0.01 to about 0.03, from about 0.015 to about 0.03, from about 0.015 to about 0.025, or from about 0.02 to about 0.03. Non-limiting examples of the value of x include 0.01, 0.015, 0.018, 0.02, 0.025, 0.03, 0.035 and 0.04. In some embodiments, y ranges from about 0.05 to about 0.25, from about 0.05 to about 0.20, from about 0.05 to about 0.15, from about 0.10 to about 0.25, or from about 0.10 to about 0.15. Non-limiting examples of the value of y include 0.05, 0.08, 0.10, 0.15, 0.20, 0.25, and 0.30.

The thickness of the ferroelectric layer may range from about 5 nm to about 150 nm. A thicker film will not degenerate its ferroelectricity but will make the NC-TFT characteristics worse due to smaller capacitance/larger voltage loaded on the NMZO film. In some embodiments, the thickness ranges from about 10 nm to about 120 nm, from about 10 nm to about 120 nm, from about 10 nm to about 100 nm, from about 20 nm to about 50 nm, from about 20 nm to about 30 nm, from about 5 nm to about 25 nm, from about 10 nm to about 25 nm or from about 15 nm to about 20 nm. Non-limiting examples of the thickness include 5, 10, 15, 20, 25, 30, 40, 50, 80, and 100 nm. In some embodiments, the ferroelectric layer $Ni_xMg_yZn_{1-x-y}O$ is free from high contamination elements such as lead and lead zirconate titanate (PZT).

In some embodiments, the NC-TFT includes a thin transition layer comprising MgO between the channel layer and the dielectric insulating layer. The MgO layer serves as a barrier to minimize $Zn^{2+}$ ions diffusion into the $SiO_2$ dielectric layer in order to enhance the TFT characteristic and stability. The thickness of MgO ranges between 5 nm and 15 nm.

Another feature of the NC-TFT is the MZO channel layer used in combination with the ferroelectric layer. The amount of Mg contributes to the thermal, threshold voltage, and negative bias stress (NBS) stability of MZO. The value of z in $Mg_zZn_{1-z}O$ (MZO) ranges larger than zero and equal/less than 0.06. In some embodiments, the value of z in $Mg_zZn_{1-z}O$ (MZO) range from from about 0.02 to about 0.05, from about 0.02 to about 0.04, or from about 0.025 to about 0.035.

The channel layer has a thickness ranging from about 10 to about 100 nm. In some embodiments, the channel layer has a thickness ranging from about 30 nm to about 80 nm, from about 30 nm to about 70 nm, from about 40 nm to about 60 nm, or from about 45 nm to about 55 nm.

The dielectric insulating layer may be composed of a material selected from $SiO_2$, $Al_2O_3$, $HfO_2$, AlN, and any combination thereof. In some embodiments, the dielectric insulating layer is composed of $SiO_2$. The dielectric insulating layer has a thickness ranging from about 10 nm to about 100 nm from about 30 nm to about 80 nm, from about 30 nm to about 60 nm, or from about 40 nm to about 60 nm.

The bottom gate configuration can be converted into the top-gate configuration by reversing a vertical sequence of the material layer structure. For instance, a top-gate configuration includes, from top to bottom, a gate electrode, a ferroelectric layer, a dielectric insulating layer, an optional transition (diffusion barrier) layer, a semiconductor channel layer. Similar manufacturing techniques can be applied to devices of the top-gate configuration. In both top and and bottom gate configurations the source and a drain metal electrodes should contact to the channel.

Figure 13A:
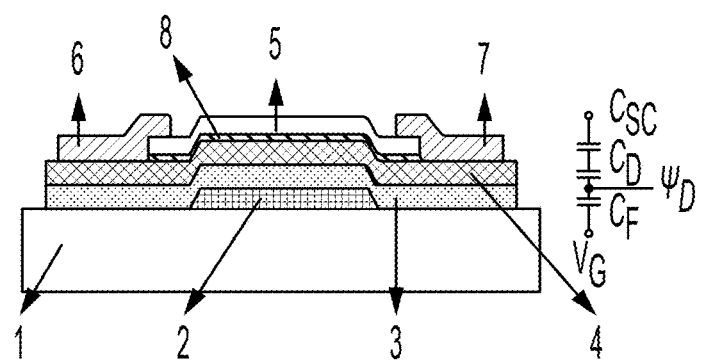
FIG. 13(a) illustrates a schematic layer structure of a bottom gate (BG)NC-TFT or NC-TTFT device with equivalent capacitance network shown on the right. The structure includes substrate 1, gate 2, ferroelectric layer 3, dielectric layer 4, semiconductor channel layer 5, source 6, drain 7, and transistion layer 8.
Figure 13B:
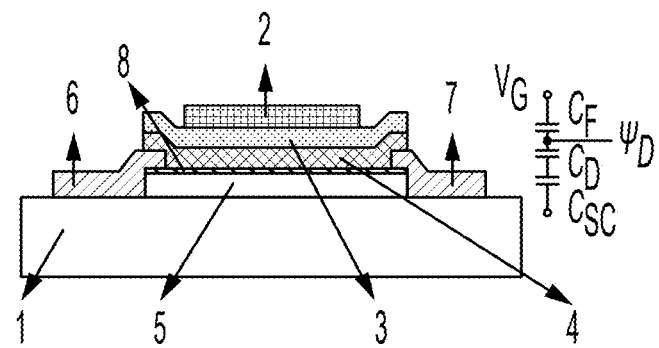
FIG. 13(b) illustrates a schematic layer structure of a top gate (TG)NC-TFT or NC-TTFT device wherein the semiconductor layer is deposited on the substrate. The structure includes substrate 1, gate 2, ferroelectric layer 3, dielectric layer 4, semiconductor channel layer 5, source 6, drain 7, and transistion layer 8.

In some embodiments, a negative capacitance thin film transistor (NC-TFT) or a negative capacitance transparent thin film transistor includes
- a substrate;
- a semiconductor $Mg_zZn_{1-z}O$ (MZO) channel layer deposited over the substrate, wherein z is greater than 0 and equal or less than 0.06;

a source and a drain metal contact or transparent conductive oxide electrodes positioned on opposite sides of the MZO channel layer;

a dielectric insulating layer deposited over the MZO channel layer, wherein an optional thin transition layer comprising MgO is deposited between the channel layer and the dielectric insulating layer (FIG. 13(*a*) or 13(*b*));

a ferroelectric layer deposited over the dielectric insulating layer, wherein the ferroelectric layer comprises $Ni_xMg_yZn_{1-x-y}O$, wherein Ni is used for doping to compensate residual electrons and x is greater than 0 and equal or less than 0.05; and Mg is used for ferroelectricity and y is greater than 0.05 and equal or less than 0.30; and a top gate electrode deposited and patterned on the ferroelectric layer.

The NC-TFT can be manufactured on various types of substrates depending on its intended use. The substrate can be a rigid or a flexible, a transparent or a non-transparent material. For instance, the substrate can be a rigid form when the NC-TFT is applied to large-area electronics. For applications of the NC-TFT on wearable electronics the substrate may be a flexible material. Non-limiting examples for substrate material include glass, ceramics, $SiO_2$, and polymer. In some embodiments, the substrate is glass.

Figure 1B:
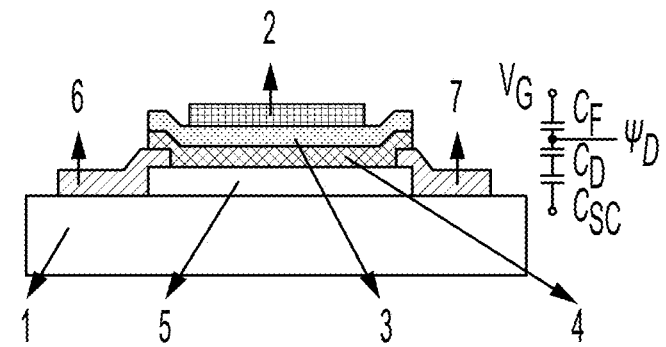
FIG. 1(b) illustrates a schematic layer structure of a top gate (TG)NC-TFT or NC-TTFT device wherein the semiconductor layer is deposited on the substrate. The structure includes substrate 1, gate 2, ferroelectric layer 3, dielectric layer 4, semiconductor channel layer 5, source 6, and drain 7.

The NC-TFT may be configured in a reverse vertical order from the above embodiments. For instance as shown in FIG. 1(*b*), the source and the drain metal contact electrodes positioned on opposite sides of the MZO channel layer can be built on the substrate. The dielectric insulating layer, the ferroelectric layer and the gate electrode can then be built up in sequence.

In some embodiments, an SS value below 60, below 50, below, 40, below, 30, or below 20 mV/decade is achieved with the NC-TFT device disclosed herein. Accordingly, a related aspect provides a method of achieving an SS value below 60, below 50, below, 40, below, 30, or below 20 mV/decade with the device disclosed herein.

Another aspect of this patent document provides an article of manufacture containing the NC-TFT disclosed herein. For instance, the NC-TFT can be incorporated into large area electronics including thin film solar system on RFID, photovoltaics, glass, sensor arrays, digital logic circuit, memory device, and displays with lower power consumption. When built on suitable substrates, the NC-TFT can also serve as an important functional component in transparent and/or flexible electronics including bendable solar cell panels, flexible displays and sensors, and other portable or wearable systems. In some embodiments, the article of manufacture is a display, a screen, a windshield, or eye glasses incorporating the NC-TFT built on glass. Due to the materials and structural design as described above, the article of manufacture can be transparent with an average transmittance of more than 80%, more than 85%, more than 90% or more than 95% in the visible light range of 380-700 nm.

In some embodiments, the NC-TTFTs are integrated into head-up displays (HUD) on windshields or screen inlaid in, for example, smart glass or information displays in subway and bus. The material for NC-TTFT can be flexible substrates including for example opaque and transparent substrates.

Another aspect provides a method of manufacturing the NC-TFT described herein. The method generally includes:
(a) depositing and patterning a bottom gate electrode on a substrate;
(b) depositing a ferroelectric layer over the substrate and the bottom gate, wherein the ferroelectric layer comprises $Ni_xMg_yZn_{1-x-y}O$, wherein x is greater than 0 and equal or less than 0.05 and y is greater than 0.05 and equal or less than 0.30;
(c) depositing a dielectric insulating layer over the ferroelectric layer;
(d) depositing $Mg_zZn_{1-z}O$ (MZO) channel layer over the dielectric insulating layer, wherein z is greater than 0 and equal or less than 0.06 and
(e) depositing a source and a drain electrodes on opposite side of the MZO channel layer.

The scope of suitable materials for various components including the substrate, the dielectric insulating layer, and the electrodes are as described above. The sub-ranges of x, y and z for $Ni_xMg_yZn_{1-x-y}O$ and $Mg_zZn_{1-z}O$ are also the same as provided earlier.

Various known techniques can be employed in the manufacturing of the NC-TFT. Procedures for depositing or growing a layer include, for example, Metalorganic Chemical Vapor Deposition (MOCVD), pulsed laser deposition (PLD), atomic layer deposition (ALD), multi-target sputtering techniques, and any combination thereof. For instance, ferroelectric layer can be deposited on the substrate using RF sputtering and a subsequent $SiO_2$ layer is deposited via plasma enhanced chemical vapor deposition (PECVD) to form the stacked gate dielectric structure. The MZO channel layer can be grown using metal organic chemical vapor deposition (MOCVD) or RF sputtering. With RF sputter, the temperature is lower than conventional processes and is more cost efficient. The source and drain metal contacts can be deposited using electron beam evaporator and then followed by a standard lift-off process. Each of these steps is performed at a suitable temperature. The manufacturing is applicable to various devices including flexile NC-TFT with for example plastic or polymer substrates.

In some embodiments, the method further includes depositing a thin transition layer of MgO on the dielectric insulating layer prior to step (d). This extra MgO layer serves as a barrier to minimize $Zn^{2+}$ ions diffusion into the $SiO_2$ dielectric layer in order to enhance the TFT characteristic and stability.

In some embodiments, step (b) is performed at a temperature selected from room temperature to about 125° C. because low temperature deposition without high temperature annealing process enables its applications for flexible substrate. In some embodiments, step (d) is performed at a temperature selected from low—as room temperature to high—up to 500° C. The low temperature deposition is used for the flexible substrates and high temperature deposition is used for rigid substrates.

The thickness of each layer in the NC-TFT may directly or indirectly impact the ferroelectric property. Therefore, the method includes selecting a suitable range for the layers (e.g. the ferroelectric layer in step (b)) to achieve an optimized result. In some embodiments, step (b) and/or step (c) further include adjusting thickness of the ferroelectric layer and dielectric layer, and/or the thickness ratio of the ferroelectric layer over the dielectric layer, to control ferroelectric property and to optimize the transistor characteristics including the current gain and leakage in the NC-TFT.

EXAMPLE

Example 1. The schematic structure of the NC-TFT and its equivalent capacitance network are shown in FIG. 1. The NC-TFT was fabricated on a 0.4 mm thick commercial glass substrate (PG&O). First, a 50 nm Cr layer was deposited and patterned, serving as the bottom gate electrode. Then, Ni and Mg co-doped ZnO, i.e. $Ni_{0.02}Mg_{0.15}Zn_{0.98-x}O$ (x=0.06, 0.10, 0.15) ferroelectric layer was deposited using RF sputtering at 125° C., followed by a 50 nm $SiO_2$ layer using plasma enhanced chemical vapor deposition (PECVD) at 400° C., to form the stacked gate dielectric structure. In an example condition, NMZO was deposited using RF sputtering (P=6 mTorr, gas ratio $Ar:O_2=1:3$, gas flow rate: Ar=4 sccm, $O_2=12$ sccm, RF=70 W, deposition at 125° C., deposition rate 0.5 Å/s) with a gas ratio 1:3. RF sputtering deposition in $O_2$ rich environment can reduce the oxygen vacancies in the NMZO film.

The $Ni_{0.02}Mg_{0.15}Zn_{0.98-x}O$ thickness was varied (25, 50, 100 nm) to adjust its ferroelectric property in NC-TFT. The 50 nm $Mg_{0.03}Zn_{0.97}O$ (MZO) channel layer was grown using metal organic chemical vapor deposition (MOCVD) at 400° C. A 5 nm MgO interface transition layer was inserted in the $SiO_2$ and MZO to serve as barrier to minimize $Zn^{2+}$ ions diffusion into the $SiO_2$ dielectric layer in order to enhance the TFT characteristic and stability. The source and drain metal contacts (100 nm Ti/50 nm Au) were deposited using electron beam evaporator and then followed by a standard lift-off process. The NC-TFT has a channel length L=5 μm and width W=160 μm, respectively. For comparison, a MZO TFT without a $Ni_{0.02}Mg_{0.15}Zn_{0.98-x}O$ layer was also fabricated to serve as the reference.

Figure 2A:
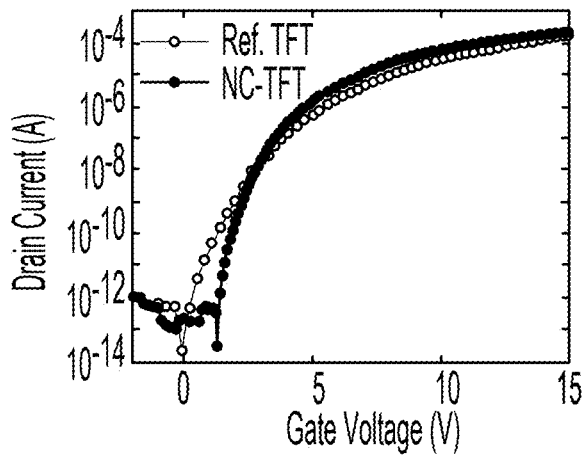
FIG. 2 illustrates characteristics of an example NC-TFT: (a) $I_{DS}$-$V_{GS}$ transfer characteristics of reference TFT and NC-TFT. (b) Subthreshold swing (SS) of reference TFT and NC-TFT over five decades of drain current in log scale. (c) $I_{DS}$-$V_{DS}$ output characteristics of NC-TFTs with $V_{GS}$ from 3 to 15 V. (d) Bi-directional $I_{DS}$-$V_{GS}$ characteristics of NC-TFT with small hysteresis 0.7 V.
Figure 2B:
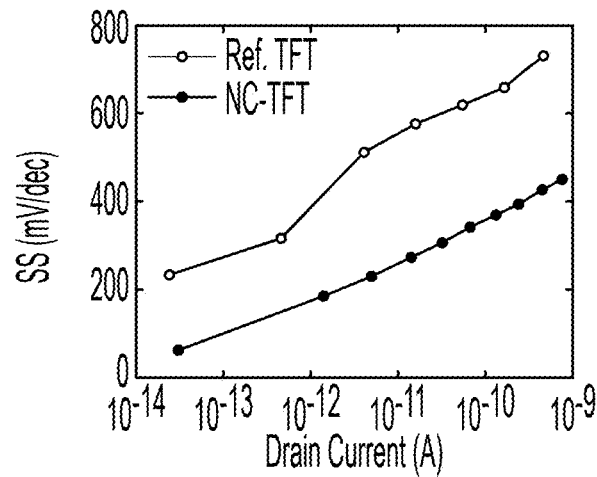
Figure 2C:
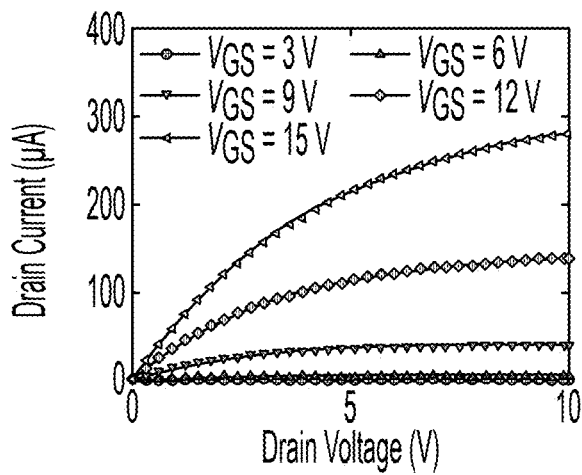
Figure 2D:
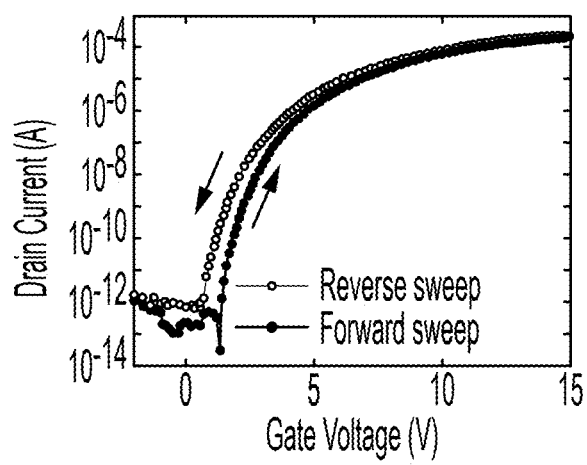

The electrical measurements were taken using semiconductor parameter analyzer (TIP 4156C). The transfer characteristics of NC-TFTs are shown in FIG. 2(a) with fixed drain-source bias voltage $V_{DS}=5$ V and sweeping bottom gate voltage $V_{GS}$ from −2 V to 15 V. FIG. 2 shows the comparisons between MZO NC-TFT and the reference MZO TFT. The MZO NC-TFT with a 25 nm ferroelectric $Ni_{0.02}Mg_{0.15}Zn_{0.83}O$ layer exhibits significantly improved SS compared to the reference one. Faster turn-on behavior was obtained as evidenced by steeper transfer characteristic curve shown in FIG. 2(a). The SS value as a function of drain current ($I_{DS}$) over five decades for both NC-TFT and reference are depicted in FIG. 2(b). The minimum SS value of the NC-TFT reaches 58 mV/dec in comparison with the reference TFT of 232 mV/dec. In addition to the reduced SS value, the NC-TFT shows the threshold voltage $V_{th}\sim 1$ V, and the on/off ratio >109 for drain current $I_{DS}$. Since both reference TFT and NC-TFT have the same MZO channel and $SiO_2$ gate dielectric, such improvement in SS is mainly caused by the introduction of $Ni_{0.02}Mg_{0.15}Zn_{0.83}O$ ferroelectric layer. Output characteristics in FIG. 2(c) shows the $I_{DS}$-$V_{DS}$ curves of the NC-TFT with various gate-source voltage $V_{GS}$ from 3 V to 15 V. FIG. 2(d) shows the polarization hysteresis in bi-directional $I_{DS}$-$V_{GS}$ characteristics with a 0.7 V discrepancy between forward sweep and reverse sweep, resulted from ferroelectric behavior in $Ni_{0.02}Mg_{0.15}Zn_{0.83}O$ layer.

Figure 3A:
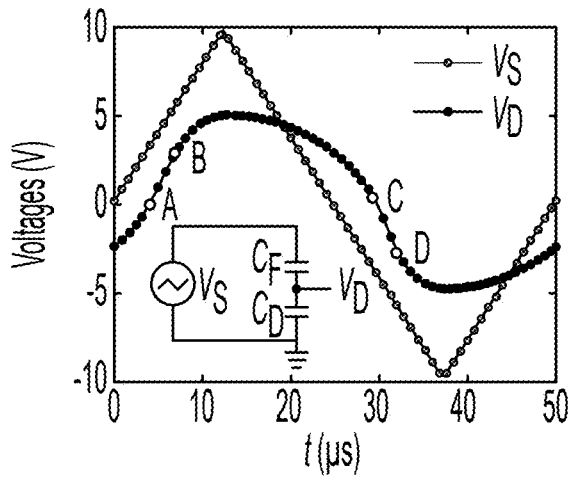
FIG. 3 illustrates time response and amplification of an example NC-TFT: (a) Time response of $V_S$ (t) and $V_D$ (t). The inset in (a) shows the schematic circuit diagram of the voltage amplification measurement in FE-DE stack. The signal $V_S$ peak to peak value $V_{PP}$=20 V, period T=50 μs. (b) Amplification $A_V$ (=$dV_D/dV_S$) as a function of $V_S$.

The negative capacitance (NC) would produce steep switching in the subthreshold regime due to the enhanced surface potential $\Psi_D$ induced from spontaneous polarization charges in the ferroelectric $Ni_{0.02}Mg_{0.15}Zn_{0.83}O$ layer in the NC-TFT (FIG. 1). The rate of change in surface potential $\Psi_D$ can be larger than the derivative of the gate voltage $V_G$ applied. This voltage amplification was analyzed using a capacitance model consisting of a series connected ferroelectric-dielectric (FE-DE) capacitors. FIG. 3(a) shows the setting for measurement of voltage amplification in FE-DE stack capacitance, where a 50 nm thick ferroelectric layer of $Ni_{0.02}Mg_{0.15}Zn_{0.83}O$ was deposited on a DE layer of 50 nm $SiO_2$. The FE-DE stack was patterned and internal/external metallization were formed to measure the voltage across DE capacitor $V_D$. Triangular ramp voltage source $V_S$ was generated by the pulse generator (AFG 3021B) and $V_D$ was measured by the digital oscilloscope (DPO 4032). The voltage response of $V_S$(t) and $V_D$(t) are plotted in FIG. 3(a), where the inset shows the ramp voltage $V_{PP}$ is 20 V and the period is 50 μs. It was observed that in segment AB, $V_D$(t) is increasing faster than $V_S$(t); whereas in segment CD, $V_D$(t) is decreasing faster than $V_S$(t). The different rate of change in $V_D$ and $V_S$ can be attributed to the voltage amplification of the source voltage $V_S$ at the interface between the FE-DE capacitors. The rate of change in $V_D$ can be written in terms of $V_S$ and the ferroelectric capacitance ($C_F$) as follows:

$$\frac{dV_D}{dt} = \frac{dV_S}{dt} - \frac{1}{C_F}\frac{dQ}{dt} \quad (1)$$

where Q is the charge across FE capacitor. Note that the voltage amplification is differential ($dV_D/dt > dV_S/dt$) and not absolute. Thus, FE capacitance shows NC effect ($C_F < 0$) when $dV_D > dV_S$.

Figure 3B:
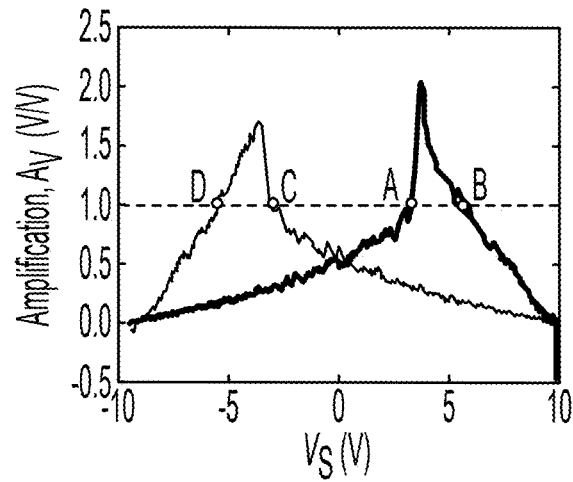

In segment AB, $V_D$ increases faster than $V_S$ ($dV_D/dt > dV_S/dt$), leading to a voltage amplification $A_V = dV_D/dV_S > 1$. It proves $C_F$ to be negative according to Eq. (1). Similarly, voltage amplification was again observed in the transient response in segment CD as $V_S$ decreased. FIG. 3(b) shows the amplification $A_V$ as a function of $V_S$. The function curve has a butterfly shape and $A_V > 1$ in segments AB and CD, when the FE capacitor is in negative capacitance state showing the NC effect. When the FE $Ni_{0.02}Mg_{0.15}Zn_{0.83}O$ layer was inserted to the MZO TFT and connected with $SiO_2$ as the gate dielectric, the amplification response produced an enhanced surface potential $\Psi_D$ at the interface of FE-DE layers. Similarly, it showed NC effect when switching the TFT in subthreshold regime as $\Psi_D$ increases faster than gate voltage $V_G$. In the NC-TFT, the voltage amplification is defined by the differential of $\Psi_D$ with respect to $V_G$ and can be expressed as $A_V = \partial \Psi_D / \partial V_G$. The voltage amplification $A_V$ and SS are closely linked:

$$SS = \frac{\partial V_G}{\partial(\log_{10} I_{DS})} = \frac{\partial \Psi_D}{\partial(\log_{10} I_{DS})}\frac{\partial V_G}{\partial \Psi_D} = \log_e 10 \times \frac{k_B T}{q} \times \left(1 + q\frac{tN_t - D_{it}}{C_D}\right) \times \frac{1}{A_V} \quad (2)$$

where q is the elementary charge, $k_B$ is the Boltzmann constant, T is the temperature, t is the channel thickness, $N_t$ is the trap density, $D_{it}$ is the interface trap density, and CD the capacitance per area of the dielectric layers (CD is $6.64 \times 10^{-4}$ F/m² for MgO/$SiO_2$ for MZO TFT). In the regular TFT without ferroelectric gate dielectric material, the amplified surface potential $A_V = 1$, and the total trap densities are calculated to be $1.19 \times 10^{12}$ cm$^{-2}$. Since the channel material is the same and its interface with $SiO_2$ dielectric layer is unchanged, the difference in SS between MZO NC-TFT and the reference MZO TFT is primarily due to the surface potential amplification $A_V$. In the NC-TFT, this voltage amplification ($A_V > 1$) was induced from spontaneous polarization charges in the ferroelectric layer to speed up the turn-on process and reduce the SS value.

Figure 4A:
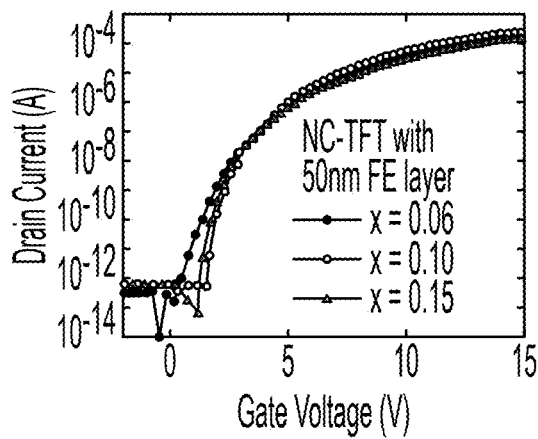
FIG. 4 illustrates $I_{DS}$-$V_{GS}$ transfer characteristics and subthreshold swing of example NC-TFTs: (a) $I_{DS}$-$V_{GS}$ transfer characteristics of NC-TFTs with 50 nm $Ni_{0.02}Mg_{0.15}Zn_{0.98-x}O$ (x=0.06, 0.10, 0.15) as ferroelectric layer. (b) Subthreshold swing (SS) of the NC-TFTs over five decades of drain current in log scale.
Figure 4B:
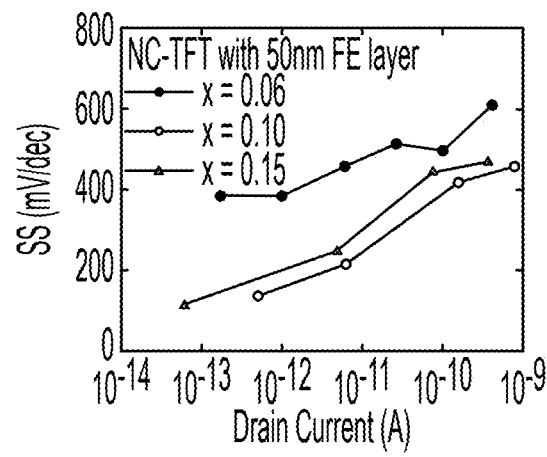

Adequate amount of $Mg^{2+}$ in MZO is needed to generate sufficient local dipole moment to form ferroelectricity. More $Mg^{2+}$ also can contribute to a relatively high curie temperature ($T_C$) to assure practical application. However, overmuch $Mg^{2+}$ ions would result in the structure change from the polar wurtzite towards the nonpolar rocksalt. To investigate the effect of Mg doping, NC-TFTs with 50 nm $Ni_{0.02}Mg_{0.15}Zn_{0.98-x}O$ (x=0.06, 0.10, and 0.15) as ferroelectric layer were measured. $I_{DS}$-$V_{GS}$ transfer characteristics curves are shown in FIG. 4(a) and corresponding SS are extracted in FIG. 4(b). It can be seen that the $Ni_{0.02}Mg_{0.06}Zn_{0.92}O$ sample with 6% Mg did not form adequate local dipole moments due to the inadequate amount of substituted $Mg^{2+}$ ions. The rest two NC-TFTs with x=10% and 15% of Mg composition displayed significant reduction of SS values, indicating substantial improvement in the turn-on speed of the NC-TFTs with Ni and Mg co-doped ZnO ferroelectric layer. Since the channel material MZO and the gate dielectric $SiO_2$ are the same, the difference in SS of NC-TFTs in FIG. 4 is due to various voltage amplifications $A_V$. In FIG. 4(b), the NC-TFT with 50 nm $Ni_{0.02}Mg_{0.15}Zn_{0.83}O$ ferroelectric layer has an improved SS of 158 mV/dec and calculated $A_V$=1.5 from Eq. (2), which is consistent with FIG. 3(b).

Figure 5A:
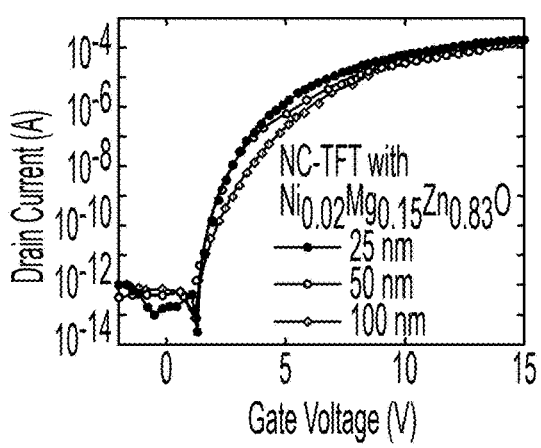
FIG. 5 illustrates $I_{DS}$-$V_{GS}$ transfer characteristics and subthreshold swing of example NC-TFTs: (a) $I_{DS}$-$V_{GS}$ transfer characteristics of NC-TFTs with 25, 50, 100 nm $Ni_{0.02}Mg_{0.15}Zn_{0.83}O$ as ferroelectric layer. (b) Subthreshold swing (SS) of the NC-TFTs over five decades of drain current in log scale.
Figure 5B:
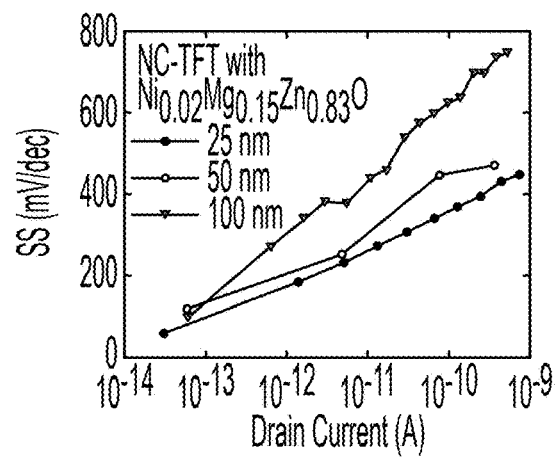

Comparisons were made by varying the ferroelectric $Ni_{0.02}Mg_{0.15}Zn_{0.83}O$ layer thickness (25, 50, 100 nm) in NC-TFT. Transfer characteristics of NC-TFTs are shown in FIG. 5(a) using the same setup parameters. The transistor with 25 nm ferroelectric shows the best $I_{DS}$-$V_{GS}$ value with steep SS behavior and highest on current ($2\times10^{-4}$ A). Specifically, SS as a function of $I_{DS}$ over five decades are plotted in FIG. 5(b). The NC-TFT device with 25 nm ferroelectric performed the overall smaller SS with the minimum value 58 mV/dec. Meanwhile, the rest two samples showed minor degradation of drain current and SS after NC-TFT fully turned on. In subthreshold regime, additional electrons were attracted to the surface of channel due to local dipole moments in the ferroelectric layer. These extra carriers were responsible for enhancing $A_V$>1 and the reduction of SS. When NC-TFT was fully turned on, the limited amount of extra carriers could no longer affect the surface potential. In this regime, $A_V$<1 as the additional ferroelectric layer decreased the overall capacitance and on-current.

Figure 6A:
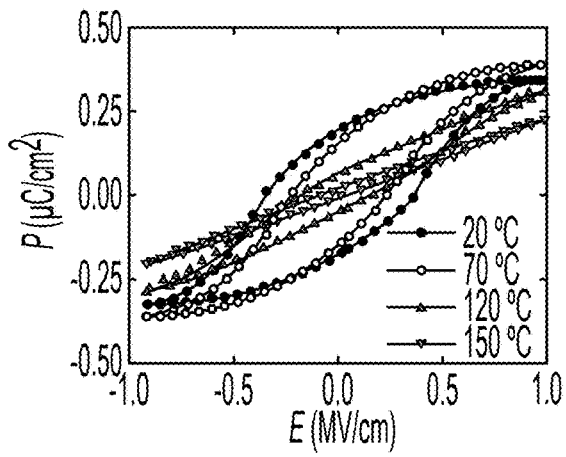
FIG. 6 illustrates ferroelectric P-E hysteresis loop and temperature dependent spontaneous polarization of a $Ni_{0.02}Mg_{0.15}Zn_{0.83}O$ sample: (a) Ferroelectric P-E hysteresis loop for $Ni_{0.02}Mg_{0.15}Zn_{0.83}O$ sample at 20° C., 70° C., 120° C., and 150° C. (b) Temperature dependent spontaneous polarization $P_S$ in $Ni_{0.02}Mg_{0.15}Zn_{0.83}O$ sample.
Figure 6B:
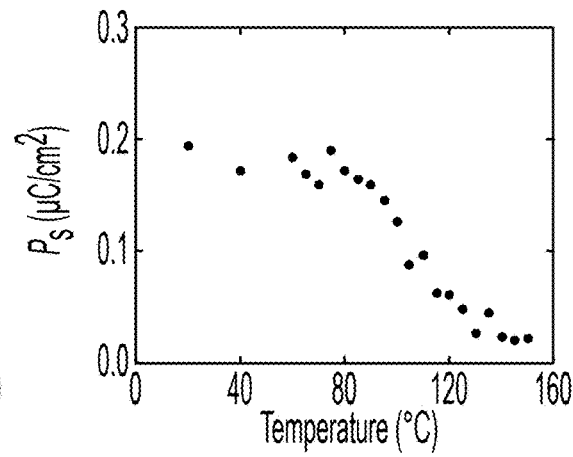

Ferroelectric polarization-field (P-E) hysteresis loops were measured from room temperature up to 150° C. using a classic Sawyer-Tower circuit. The P-E measurements confirm the ferroelectric nature in $Ni_{0.02}Mg_{0.15}Zn_{0.83}O$ as shown in FIG. 6(a). The spontaneous polarization ($P_S$) is 0.2 $\mu C/cm^2$ when E=0 in room temperature, and the coercive electric field (Ec) is 0.3 MV/cm. The polarization of the FE layer reduced the electric field inside the FE film, and hence increased the electric field in the DE film. FIG. 6(b) shows temperature dependence of $P_S$, where $T_C$ is about 120° C., suggesting that $T_C$ is well above room temperature, allowing adequate temperature range of $Ni_{0.02}Mg_{0.15}Zn_{0.83}O$ for NC-TFT applications.

Example 2. A negative capacitance transparent thin-film transistor (NC-TTFT) on glass was fabricated. The schematic structure of an NC-TTFT is shown in FIG. 1. A 50 nm Cr gate electrode was deposited and patterned on a 400 $\mu m$ thick commercial glass substrate (PG&O). A 25 nm $Ni_{0.02}Mg_{0.15}Zn_{0.83}O$ (NMZO) ferroelectric layer was deposited using RF sputtering at 125° C., followed by a 50 nm $SiO_2$ layer formed using plasma-enhanced chemical vapor deposition (PECVD) at 400° C. The 50 nm $Mg_{0.03}Zn_{0.97}O$ (MZO) channel layer was deposited using RF sputtering system at 125° C. A ~10 nm MgO transition layer was inserted between the $SiO_2$ and MZO channel to serve as a barrier to minimize $Zn^{2+}$ ions diffusion into the $SiO_2$ dielectric layer to enhance the TFT characteristics and stability. The NC-TTFT has a channel length L=5 $\mu m$ and width W=160 $\mu m$. Transparent conductive oxide AZO was used as source and drain contacts. The 200 nm AZO layer was sputtered at 104 W and under working pressure of 10.5 mTorr using a target of zinc oxide mixed with alumina (ZnO:$Al_2O_3$, 98/2 wt %). For comparison, a transparent thin-film transistor (TTFT) with the same layer structure, except the gate dielectric consisting of 50 nm $SiO_2$ without the ferroelectric NMZO layer, was fabricated under the same condition to serve as the reference.

Figure 7:
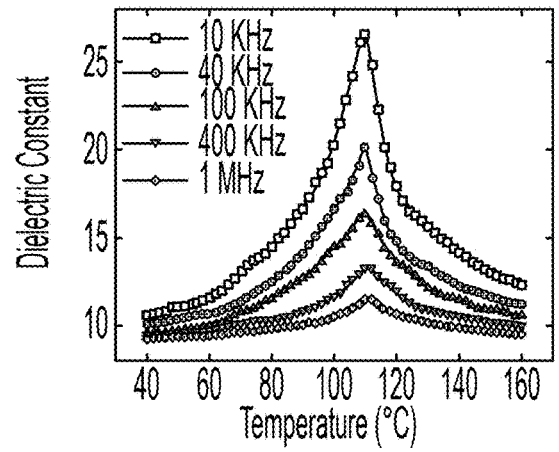
FIG. 7 illustrates temperature dependence of dielectric constants in the $Ni_{0.02}Mg_{0.15}Zn_{0.83}O$ film under frequencies from 10 KHz to 1 MHz.

In a classical ferroelectric material, the dielectric constant peaks at the Curie temperature, corresponding to the transition from a ferroelectric to a paraelectric phase. This transition temperature value has no variation as a function of frequency. HP 4275A multi-frequency LCR meter was used in measuring capacitance under different sets of frequencies. Frequency range was set from 10 kHz up to 1 MHz. $Ni_{0.02}Mg_{0.15}Zn_{0.83}O$ capacitor samples with metal electrodes on the top and bottom were fabricated. The $Ni_{0.02}Mg_{0.15}Zn_{0.83}O$ samples were heated from 40° C. to 160° C. and dielectric constant can be extracted from $C=\varepsilon_r\varepsilon_0 A/d$. FIG. 7 shows the temperature dependence of dielectric constants of a $Ni_{0.02}Mg_{0.15}Zn_{0.83}O$ film tested under different frequencies. The dielectric constants peak is located at Curie temperature, $T_C$=110° C., which demonstrated the appearance of ferroelectricity in $Ni_{0.02}Mg_{0.15}Zn_{0.83}O$ due to the local dipole moments.

Figure 8A:
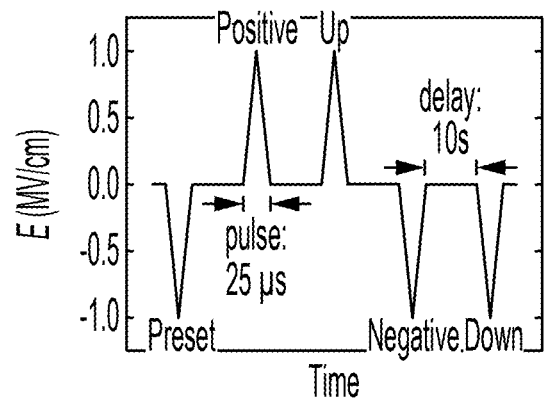
FIG. 8 illustrates (a) principle of PUND method: a first preset pulse is applied and then two positive pulses and two negative pulses. (b) Switching and the (c) non-switching half loops in PUND test of $Ni_{0.02}Mg_{0.15}Zn_{0.83}O$ sample.
Figure 8B:
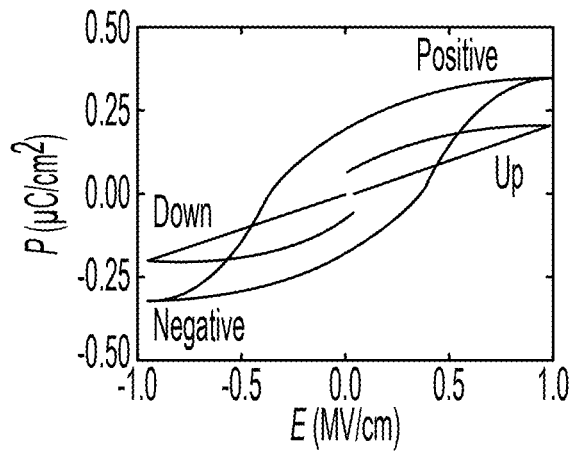
Figure 8C:
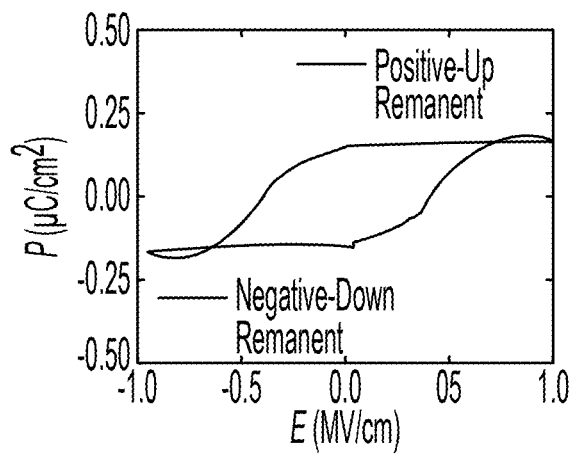

Hysteresis loop is a typical characteristic behaviour for ferroelectric materials. However, it has been proved that a polarization-electric field (P-E) hysteresis measurement could be deficient in determining the ferroelectricity of layers which have large leakage currents. A banana-shaped lossy P-E loop may trick one the evidence of ferroelectricity from artefact. In fact, the P-E hysteresis curves could be distorted by leakage current, leading to overestimation of remanent polarization ($P_r$). To prove the ferroelectricity unequivocally, a switchable polarization measurement, e.g., positive up negative down (PUND) tests, were conducted for the $Ni_{0.02}Mg_{0.15}Zn_{0.83}O$ sample. Using a classic Sawyer-Tower circuit from P-E measurement, the PUND test was based on a specific waveform applied on the NMZO sample. The principle of PUND is shown in FIG. 8(a). Two positive and two negative triangular pulses are used instead of having a full period triangular wave. A first pre-set voltage pulse was applied to force all the dipoles to be oriented in the same direction. Then a series of two voltage pulses of the opposite sign was applied, and polarization of the NMZO sample was measured. During the first positive pulse period, dipoles were switched into the opposite direction under the applied voltage. A large switching half-loop was recorded in FIG. 8(b). The second voltage pulse was the positive unswitched pulse. During this period, dipoles were already in the same direction as the external electric field. A small non-switching half-loop was recorded in FIG. 8(b). Polarizations in the non-switching half-loop were attributed to the resistive and capacitive components of NMZO film. By subtracting the switching curve from the non-switching curve, the difference in the half-loops is the remanent polarization of the as-deposited NMZO film (FIG. 8(c)). Only intrinsic ferroelectric displacement was left, and the charges caused by leakage current and dielectric displacement current were excluded. FIG. 8(c) shows that the $2P_r$ value of the NMZO film is 0.3 $\mu C\ cm^2$.

Figure 9A:
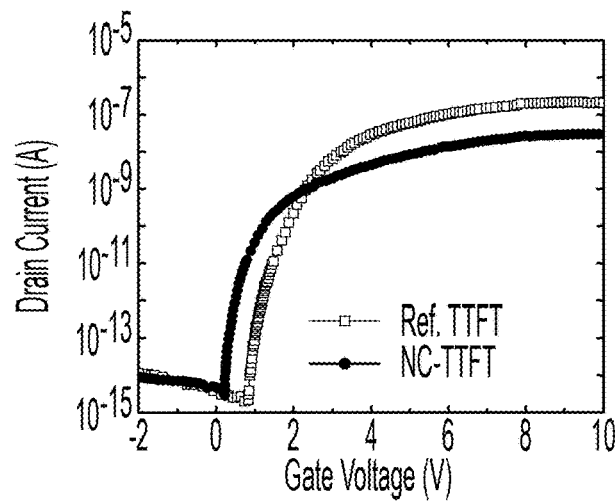
FIG. 9 illustrates characteristics of an example NC-TTFT: (a) $I_{DS}$-$V_{GS}$ transfer characteristics of reference TTFT and NC-TTFT using AZO as source/drain electrodes. (b) Gate leakage current of the reference TTFT and NC-TTFT. (c) Extracted point SS values of reference TTFT and NC-TTFT over four decades of drain current in log scale.
Figure 9B:
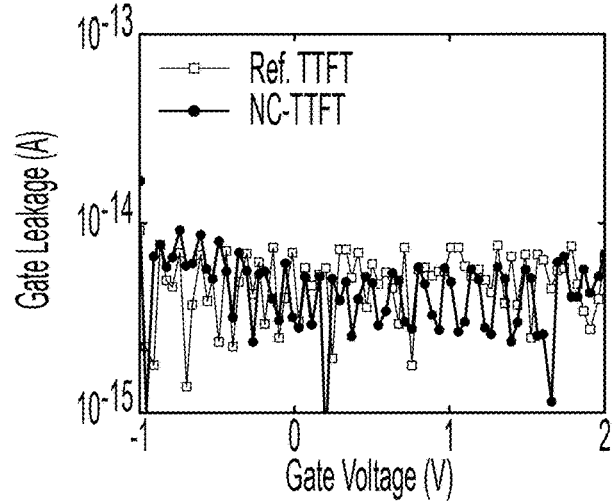
Figure 9C:
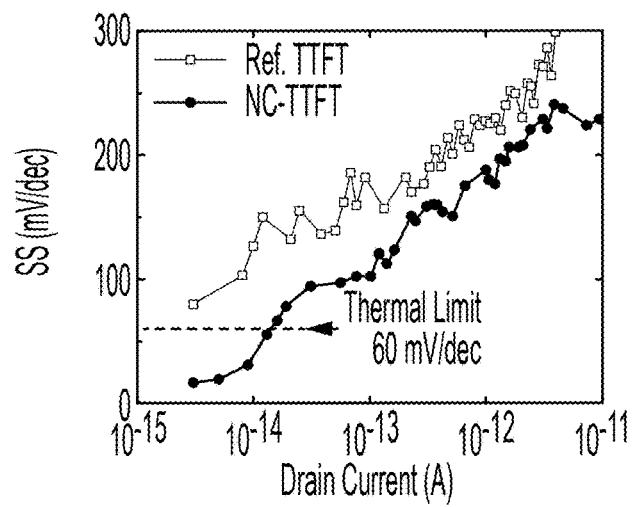
Figure 10:
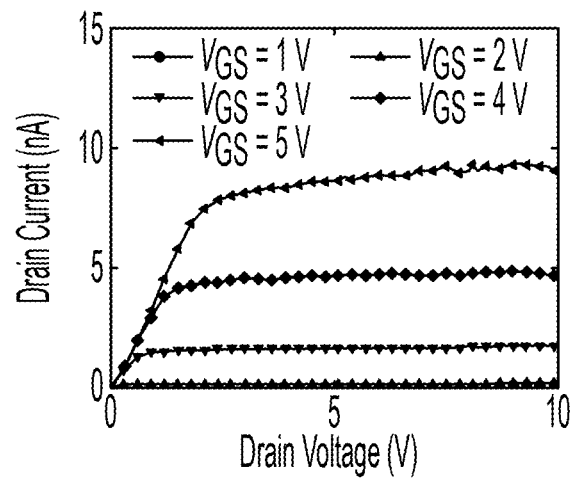
FIG. 10 illustrates $I_D$-$V_D$ output characteristics of NC-TTFTs with $V_{GS}$ from 1 to 5 V.

The measured transfer characteristics of NC-TTFT with 25 nm NMZO ferroelectric and 50 nm $SiO_2$ dielectric were shown in FIG. 9(a). The TTFT consisting of only 50 nm SiO$_2$ as gate dielectric is used as a reference. The sweeping gate voltage V$_{GS}$ is from −2 V to 10 V with a step of 5 mV and the fixed drain-source bias V$_{DS}$ is 5 V. The NC-TTFT with 25 nm ferroelectric NMZO layer exhibits a faster turn-on behavior over the reference TTFT using the same structure without the ferroelectric layer. The NC-TTFT maintains normally-off operation with threshold voltage V$_{th}$ of 0.8 V defined at 10 pA. FIG. 9(b) shows that the gate leakage currents are in the 10$^{-15}$ A level for both NC-TTFT and reference TTFT, which is smaller than the drain current in the subthreshold region. The sheet resistance of 200 nm AZO film was measured using a four-point probe (Ossila), and resistivity was extracted as 6.9×10$^{-2}$ Ω·cm. Despite the large footprint of source/drain electrodes, the on-state current dropped to 30 nA compared to the NC-TFT using Ti/Au as source/drain electrodes. Thus, the NC-TTFT has an on/off I$_D$ ratio of ~10$^7$. The extracted SS values as a function of drain current (I$_D$) over four decades for both NC-TTFT and reference TTFT devices were measured in FIG. 9(c) with a dash line indicating the thermal limit of 60 mV/dec. The NC-TTFT demonstrates a significant SS improvement, and the transfer curve reaches the minimum SS value 17 mV/dec in comparison with the reference TTFT of 80 mV/dec. Since both NC-TTFT and the reference TTFT have the same MZO channel and SiO$_2$ gate dielectric, such improvement in SS is mainly caused by the insertion of an NMZO ferroelectric layer. In the subthreshold regime, additional electrons are attracted to the ferroelectric-dielectric (FE-DE) interface due to local dipole moments in the ferroelectric layer. These extra carriers are responsible for the enhancement of carrier accumulated in the channel and the reduction of SS. When NC-TTFT is fully turned on, the limited number of extra carriers performs little effect on the channel and NC-TTFT with a thicker ferroelectric layer shows lower on-state current due to the decreased overall capacitance. Output characteristics in FIG. 10 show the I$_D$-V$_{DS}$ curves with V$_{GS}$ from 1 V to 5 V.

Figure 11:
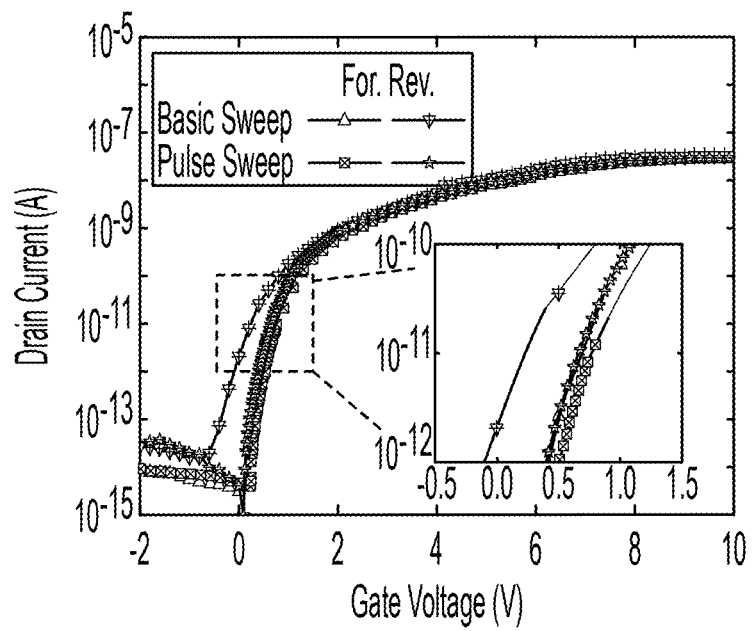
FIG. 11 illustrates bi-directional transfer characteristics of NC-TTFT using continuously basic sweep and pulse sweep, respectively.

It is reported that unidirectional pulsed I-V measurements were used to unequivocally prove the reduced SS values resulting from the NC effect instead of traps. The short pulses do not provide sufficient time for trap-assist tunneling within the oxide of gate dielectric but to acquire a direct evidence of the NC effect in the NMZO/SiO$_2$ gate dielectric stack. A bi-directional pulse was used to measure the I-V characteristics of NC-TTFT to avoid free charges injected into the FE-DE interface, which would result in hysteretic switching due to the screening of the polarization charge. The I-V transfer curves obtained using continuously basic sweep were compared to the pulse sweep counterpart. The hysteresis window is defined as the difference in V$_{th}$ between forward and reverse sweep. As shown in FIG. 11, the hysteresis window was reduced from 0.4 V to 0.1 V using pulse sweep. This may be attributed to the combination of mitigated charge injection for ferroelectric switching and the remaining trap defects.

Further analysis indicates that the SiO$_2$ dielectric layer has direct contact with NMZO ferroelectric layer, reducing the immediate screening of the polarization charge by free charge carriers. And the pulsed I-V measurements further reduce the trap-assist tunneling in the gate oxide SiO$_2$, suggesting the steep SS of NC-TTFT is not from the known traps but the negative capacitance effect in the NMZO/SiO$_2$ layers.

Figure 12:
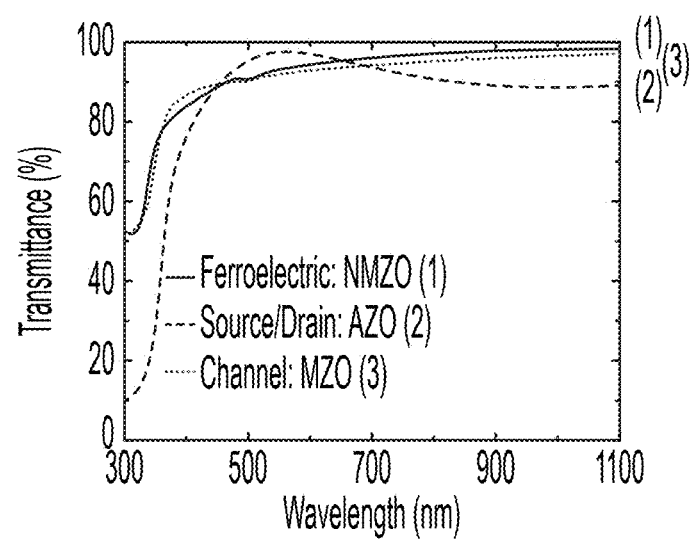
FIG. 12 illustrates optical transmission spectra for NMZO, AZO, and MZO films.

The NC-TTFT on glass has excellent transparency resulted from the wide energy bandgap ZnO and MZO based materials used: semiconductor MZO, ferroelectric NMZO, and transparent source/drain electrodes AZO. The NC-TTFT is highly transparent in the visible range. To evaluate the transmittance of the ZnO and MZO based materials in NC-TTFT, 25 nm NMZO, 200 nm AZO, and 50 nm MZO thin films were deposited on glass substrates, respectively. FIG. 12 shows the optical transmittance spectrum was measured using PerkinElmer Lambda 1050+UV/Vis/NIR spectrophotometer. 25 nm NMZO, 200 nm AZO, and 50 nm MZO thin-film samples showed an average transmittance of 92.1%, 93.3%, and 91.6% in the visible light range of 380-700 nm, respectively. The interference fringes were observed in the 200 nm AZO thin-film sample due to its increased thickness, indicating the smoothness of the reflection surface with less scattering loss at the surface.

It will be understood by those of skill in the art that numerous and various modifications can be made without departing from the spirit of the present invention. Therefore, it should be understood that the various embodiments of the present invention described herein are illustrative only and not intended to limit the scope of the present invention.

The invention claimed is:

1. A negative capacitance thin film transistor (NC-TFT), comprising
    a substrate;
    a gate electrode,
    a ferroelectric layer deposited over the gate electrode and the substrate, wherein the ferroelectric layer comprises Ni$_x$Mg$_y$Zn$_{1-x-y}$O, wherein Ni is used for doping to compensate residual electrons and x is greater than 0 and equal or less than 0.05; and Mg is used for ferroelectricity and y is greater than 0.05 and equal or less than 0.30;
    a dielectric insulating layer in contact with the ferroelectric layer to form a gate dielectric stack structure;
    a semiconductor Mg$_z$Zn$_{1-z}$O (MZO) channel layer deposited over the dielectric insulating layer, wherein z is greater than 0 and equal or less than 0.06, wherein the channel layer is in contact with the dielectric insulating layer or via a thin transition layer;
    a pair of source and drain contact electrodes deposited on opposite sides of the MZO channel layer.

2. The NC-TFT of claim 1, wherein x value of the ferroelectric layer Ni$_x$Mg$_y$Zn$_{1-x-y}$O ranges from about 0.01 to about 0.03.

3. The NC-TFT of claim 1, wherein y value of the ferroelectric layer Ni$_x$Mg$_y$Zn$_{1-x-y}$O ranges from about 0.08 to about 0.20.

4. The NC-TFT of claim 1, wherein the ferroelectric layer has a thickness ranging from 5 nm to 30 nm.

5. The NC-TFT of claim 1, wherein z value of the semiconductor channel layer Mg$_z$Zn$_{1-z}$O ranges from about 0.02 to about 0.05.

6. The NC-TFT of claim 1, wherein the semiconductor MZO channel layer has a thickness ranging from about 10 nm to about 100 nm.

7. The NC-TFT of claim 1, wherein the dielectric insulating layer has a thickness ranging from about 10 nm to about 100 nm.

8. The NC-TFT of claim 1, which comprises the thin transition layer comprising MgO between the channel layer and the dielectric insulating layer, wherein its thickness ranges from about 5 nm to about 15 nm.

9. The NC-TFT of claim 1, wherein the dielectric insulating layer comprises a material selected from the group consisting of SiO$_2$, Si$_3$N$_4$, Al$_2$O$_3$, HfO$_2$, AlN, and any combination thereof.

10. The NC-TFT of claim 1, wherein the dielectric insulating layer consists essentially of SiO$_2$.

11. The NC-TFT of claim 1, wherein the substrate comprises a rigid material selected from the group consisting of glass, ceramics, and single crystals.

12. The NC-TFT of claim 1, wherein the substrate comprises a flexible material selected from the group consisting of polymers and plastics.

13. The NC-TFT of claim 1, wherein the bottom gate electrode comprises an opaque metal selected from the group consisting of Cr, Al, Ti, Au and combination thereof.

14. The NC-TFT of claim 1, wherein the gate electrode, source and drain electrodes comprise a transparent conductive oxide (TCO) selected from the group consisting of AlZnO (AZO), GaZnO (GZO), InSnO (ITO), and InZnO (IZO).

15. The NC-TFT of claim 1, wherein the substrate is transparent and is selected from the group consisting of glass, ceramics, and plastics.

16. The NC-TFT of claim 1, which is transparent.

17. A method of manufacturing the NC-TFT of claim 1, comprising
(a) depositing and patterning a bottom gate electrode on a substrate;
(b) depositing and patterning a ferroelectric layer over the substrate and the bottom gate, wherein the ferroelectric layer comprises $Ni_xMg_yZn_{1-x-y}O$, wherein x is greater than 0 and equal or less than 0.05 and y is greater than 0.05 and equal or less than 0.30;
(c) depositing and patterning a dielectric insulating layer over the ferroelectric layer;
(d) depositing and patterning semiconductor $Mg_zZn_{1-z}O$ (MZO) channel layer over the dielectric insulating layer, wherein z is greater than 0 and equal or less than 0.06; and
(e) depositing and patterning a source and a drain electrodes on opposite side of the MZO channel layer.

* * * * *